(12) United States Patent
Yoneya

(10) Patent No.: US 7,321,279 B2
(45) Date of Patent: Jan. 22, 2008

(54) SURFACE ACOUSTIC WAVE ELEMENT

(75) Inventor: Katsuro Yoneya, Nagano (JP)

(73) Assignee: Seiko Epson Corporation (JP)

( * ) Notice: Subject to any disclaimer, the term of this patent is extended or adjusted under 35 U.S.C. 154(b) by 251 days.

(21) Appl. No.: 11/185,992

(22) Filed: Jul. 20, 2005

(65) Prior Publication Data
US 2006/0017524 A1 Jan. 26, 2006

(30) Foreign Application Priority Data
Jul. 22, 2004 (JP) ............... 2004-214392

(51) Int. Cl.
H03H 9/64 (2006.01)
H03H 9/25 (2006.01)
(52) U.S. Cl. .................. 333/195; 310/313 D
(58) Field of Classification Search ........ 333/193, 333/195; 310/313 B, 313 D
See application file for complete search history.

(56) References Cited

U.S. PATENT DOCUMENTS 4,081,769 A * 3/1978 Shreve ............... 333/195
6,384,698 B1 5/2002 Hayashi
7,038,560 B2 * 5/2006 Yoneya ............... 333/195
7,138,890 B2 * 11/2006 Nakamura et al. ........ 333/195

FOREIGN PATENT DOCUMENTS

| JP | 60-43912 | * | 3/1985 | ........... 333/195 |
| JP | 11-17493 | * | 1/1999 | |
| JP | WO00-67374 A | | 9/2000 | |

OTHER PUBLICATIONS

Communication from European Patent Office re: related application, dated Aug. 2005.

* cited by examiner

Primary Examiner—Barbara Summons
(74) Attorney, Agent, or Firm—Harness, Dickey & Pierce, P.L.C.

(57) ABSTRACT

A surface acoustic wave element includes a pair of interdigital transducers arranged in parallel with a propagation direction of a surface acoustic wave; a reflector prepared at both sides of the interdigital transducers; and a coupling portion, which mutually couples one end of a plurality of electrode fingers constituting one electrode portion of each interdigital transducer to be in common, wherein each of the electrode fingers includes a plurality of straight line portions that intersect with the coupling portion, and a bending portion prepared between these straight line portions.

2 Claims, 5 Drawing Sheets

SURFACE ACOUSTIC WAVE ELEMENT

RELATED APPLICATIONS

This application claims priority to Japanese Patent Application No. 2004-214392 filed Jul. 22, 2004 which is expressly incorporated by reference herein in its entirety.

BACKGROUND

1. Technical Field

The present invention relates to a surface acoustic wave element, and particularly relates to a multiplex-mode filter having a wide pass band.

2. Related Art

A surface acoustic wave (SAW) element includes a SAW filter used as a frequency selective element in transmission circuits, a SAW resonator which outputs a constant resonant frequency and the like. The SAW filter is utilized as an intermediate frequency (IF) filter, a radio frequency filter, or the like in mobile communications terminals, such as a cellular phone, for example. Particularly, a lateral multiplex-mode SAW filter is widely utilized as the IF filter among SAW filters.

Incidentally, because communications systems in recent years adopted a digital communication system, an IF filter having a relatively wide pass band is needed. In FIG. 3, a schematic plan view of a SAW filter related to the conventional art is shown. A SAW filter 1 as shown in FIG. 3 has a configuration in which two SAW resonators 3 are arranged closely on a piezo-electric substrate 2, in parallel with the propagation direction of a surface acoustic wave. Each SAW resonator 3 comprises an interdigital transducer (IDT) 4, a reflector 5 and the like, and the above IDT4 has a configuration which includes a plurality of power-supply conductors 6 (6a, 6b) along the propagation direction of the surface acoustic wave, and in which an electrode finger 7a is extend-prepared from the central power-supply conductor 6a towards the power-supply conductor 6b at both sides, and at the same time an electrode finger 7b is extend-prepared from the power-supply conductor 6b at both sides towards the central power-supply conductor 6a. With this configuration, the pass band width is made wider and miniaturization is attained.

International Publication No. 00/67374 is an example of the related art.

In the SAW filter described above, regarding a width D of the power-supply conductor and the bandwidth, there is a relationship shown in FIG. 4. This relationship shows that the narrower the width D of the power-supply conductor, the wider the bandwidth. Accordingly, in order to widen the pass band of the filter, it is necessary to narrow the width D of the power-supply conductor.

In FIG. 5, a relationship between the width D and the resistance of the power-supply conductor is shown. This relationship indicates that there is an inversely proportional relationship between the width and the resistance portion of the power-supply conductor, and that if the width D of the power-supply conductor is narrowed, the resistance produced in the power-supply conductor becomes large. Also, in FIG. 6, a relationship between the resistance portion and a filter loss is shown. This relationship indicates that the filter loss increase, as the resistance portion produced in the power-supply conductor increases. Accordingly, if the width D of the power-supply conductor is narrowed in order to make the pass band of a filter wider, the resistance loss of the power-supply conductor will increase, and furthermore the insertion loss of the filter will increase, consequently.

Moreover, as for the power-supply conductor in the central portion, the width D of the power supply conductor is narrow, and the power supply conductor is routed from one end to the other end of the IDT along the propagation direction of the surface acoustic wave, and at the same time this power-supply conductor is coupled with an input terminal via a coupling conductor. Therefore, the resistance loss of the power-supply conductor will increase further, and consequently, the insertion loss of the filter will also increase further.

SUMMARY

An advantage of the invention is to provide a surface acoustic wave element having a small insertion loss and a wide pass band.

The surface acoustic wave element according to an aspect of the invention is a surface acoustic wave element having a pair of interdigital transducers arranged in parallel with a propagation direction of a surface acoustic wave and a reflector prepared at both sides of these interdigital transducers, wherein a coupling portion, which mutually couples one end of a plurality of electrode fingers constituting one electrode portion of each interdigital transducer, is made to be in common, and wherein each electrode finger includes a plurality of straight line portions that intersect with the coupling portion, and a bending portion prepared between these straight line portions. In this case, the bending direction of the bending portion formed in one of the interdigital transducers and the bending direction of the bending portion formed in the other interdigital transducer can be configured so as to be bent in the same direction. One interdigital transducer becomes the input electrode, and the other interdigital transducer becomes the output electrode. Since this interdigital transducer is configured to have the bending portion, the resistance loss of the coupling portion can be made smaller, and thus the insertion loss of the surface acoustic wave element can be made smaller.

According to another aspect of the invention, it is preferable that the bending portion formed in the interdigital transducer has an offset of $\lambda/2$ ($\lambda$: a wavelength of the surface acoustic wave) between one end side and the other end side of this bending portion, and that a gap of $\lambda/2$ is formed between the straight line portion to be connected to the one end side and the straight line portion to be connected to the other end side. Thereby, if an electrical signal is supplied to the input electrode, a surface acoustic wave will be excited, and further a surface acoustic wave will also be excited by an acoustic-coupling at the output electrode. At this time, the bending portion is provided in the electrode finger of the interdigital transducer, a driving electric field, which is inverted by 180° with the bending portion being interposed, can be generated. Accordingly, the surface acoustic wave of an S1 mode and an A1 mode can be excited in the surface acoustic wave element.

According to a further aspect of the invention, it is preferable that the coupling portion of the interdigital transducer being made to be in common is electrically coupled with the reflector. Thereby, the surface acoustic wave of the S1 mode and the A1 mode can be excited in the surface acoustic wave element.

BRIEF DESCRIPTION OF THE DRAWINGS

The invention will be described with reference to the accompanying drawings, wherein like numbers refer to like element, and wherein.

DETAILED DESCRIPTION

Figure 1:
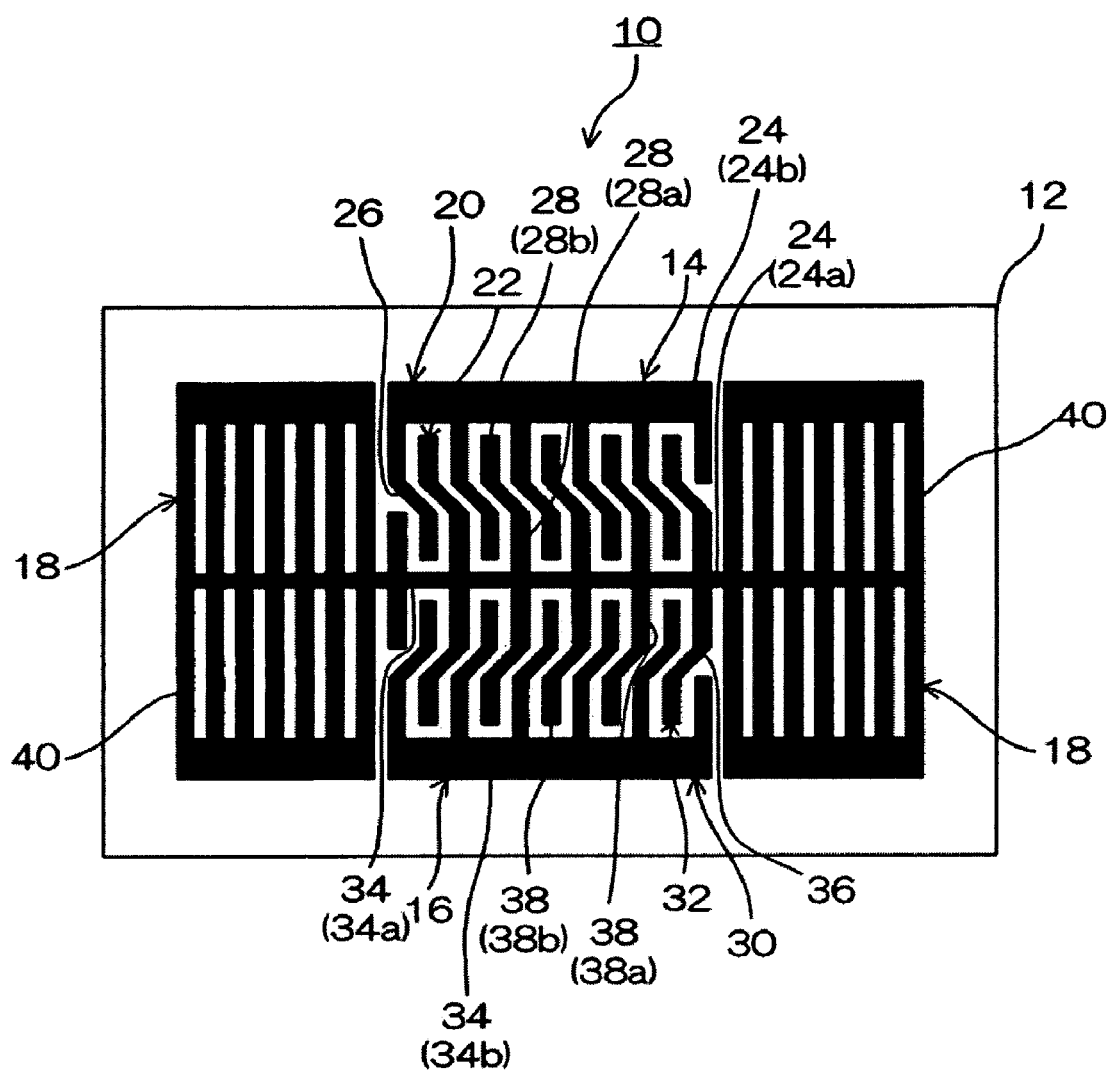
FIG. 1 is a schematic plan view of a surface acoustic wave element concerning the embodiment of the invention.

Hereinafter, a desirable embodiment of a surface acoustic wave element concerning the invention will be described. In FIG. 1, a schematic plan view of a surface acoustic wave element is shown. A surface acoustic wave (SAW) element 10 is configured to mainly include an input electrode 14, an output electrode 16, and a reflector 18 on a piezo-electric substrate 12.

The above-described input electrode 14 is formed of a pair of interdigital transducers (IDT) 20. Each IDT 20 is formed to have a plurality of electrode fingers 22, wherein one end of each electrode finger 22 is short-circuited at coupling portions 24 (24a, 24b). A pair of IDTs 20 is formed by engaging the electrode finger 22 of each IDT 20, alternately. A bending portion 26, which takes a constant distance apart from the side edge of the coupling portions 24 of IDT 20, and at the same time is bent aslant to the direction to which the electrode finger 22 is extending, is formed on each electrode finger 22, and straight line portions 28 (28a, 28b) are formed at both ends of the bending portion 26. This bending portion 26 is bent in the same direction in each electrode finger 22, and the distance to be bent is one half of the wavelength λ of a surface acoustic wave excited on the piezo-electric substrate 12 by supplying an electrical signal to IDT 20. Accordingly, the gap in the electrode-finger engaging direction, between the straight line portion 28a and the straight line portion 28b, in each electrode finger 22 is λ/2 apart.

The above-described output electrode 16 is formed in parallel with the input electrode 14 with respect to the propagation direction of the surface acoustic wave. This output electrode 16 is formed of a pair of IDTs 30, and each IDT 30 is formed short-circuiting one end of a plurality of electrode fingers 32 at the coupling portion 34 (34a, 34b). A bending portion 36, which is a constant distance apart from the side edge of the coupling portion 34 of IDT 30, and at the same time bends in the same direction as the bending direction of the bending portion 26 prepared in the input electrode 14, is formed on each electrode finger 32. This bending portion 36 is bent aslant to the direction to which the electrode finger 32 is extending, and the distance to be bent is one half of the wavelength λ of the surface acoustic wave excited on the piezo-electric substrate 12. At both ends of this bending portion 36, straight line portions 38 (38a, 38b) are formed, and the gap in the electrode finger engaging direction, between the straight line portion 38a and the straight line portion 38b in each electrode finger 32 is λ/2 apart. The straight line portions 28 and 38 along the engaging direction of the electrode fingers 22 and 32 in the input electrode 14 and output electrode 16 will serve as the propagation path of the surface acoustic wave.

The coupling portion 24a of the input electrode 14 arranged at the output electrode 16 side, and the coupling-portion 34a of the output electrode 16 arranged at the input electrode 14 side are formed to be in common. Namely, the input electrode 14 and the output electrode 16 are configured to have three coupling portions 24b, 24a (34a), and 34b which are directed in a prescribed direction according to the cut angle of the piezo-electric substrate 12 and formed in parallel, and to extend-prepare a plurality of electrode fingers 22 and 32 so as to extend from the central coupling portion 24a (34a) towards the coupling portions 24b and 34b of both sides, and at the same time extend-prepares a plurality of electrode fingers 22 and 32 so as to extend towards the central coupling portion 24a (34a) from the coupling portions 24b and 34b at both sides, and also extend-prepares the bending portions 26 and 36 in the position with a constant distance apart from both side edges of the central coupling portion 24a (34a). Accordingly, the input electrode 14 and the output electrode 16 become line symmetrical on the basis of the central coupling portion 24a (34a).

The above-described reflector 18 is configured to be formed at both sides of the input electrode 14 and output electrode 16 in the engaging direction of the electrode fingers 22 and 32 each forming IDT 20 and 30, respectively, and to have a plurality of electrode fingers 40. Then, as for the common coupling portion of the input electrode 14 and the output electrode 16, i.e., the center coupling portion 24a (34a), both sides of which are extend-prepared to electrically couple with the reflector 18. This reflector 18 is grounded electrically.

Such a SAW element 10 is manufactured as follows. First, on a piezo-electric wafer, a metal forming electrode such as IDT 20 and 30, or the reflector 18, for example, a metal of an aluminum system or the like, is film-formed by a film-forming method such as a sputtering. Next, photoresist is applied onto this metal film. Then, after having transferred an electrode pattern drawn on a photo mask or a reticle onto a photoresist using an aligner, this photoresist is developed. Subsequently, the photoresist in the portions other than the electrode-pattern forming portion is removed. Then, the metal film is etched using the remaining photoresist as the mask, to remove the above-described metal film of the portions other than the electrode pattern formatting portion. Then, when the photoresist used as the mask is removed, the electrode will be formed on the piezo-electric wafer, and then by dicing to cut into each chip, the SAW element 10 is manufactured.

Figure 2:
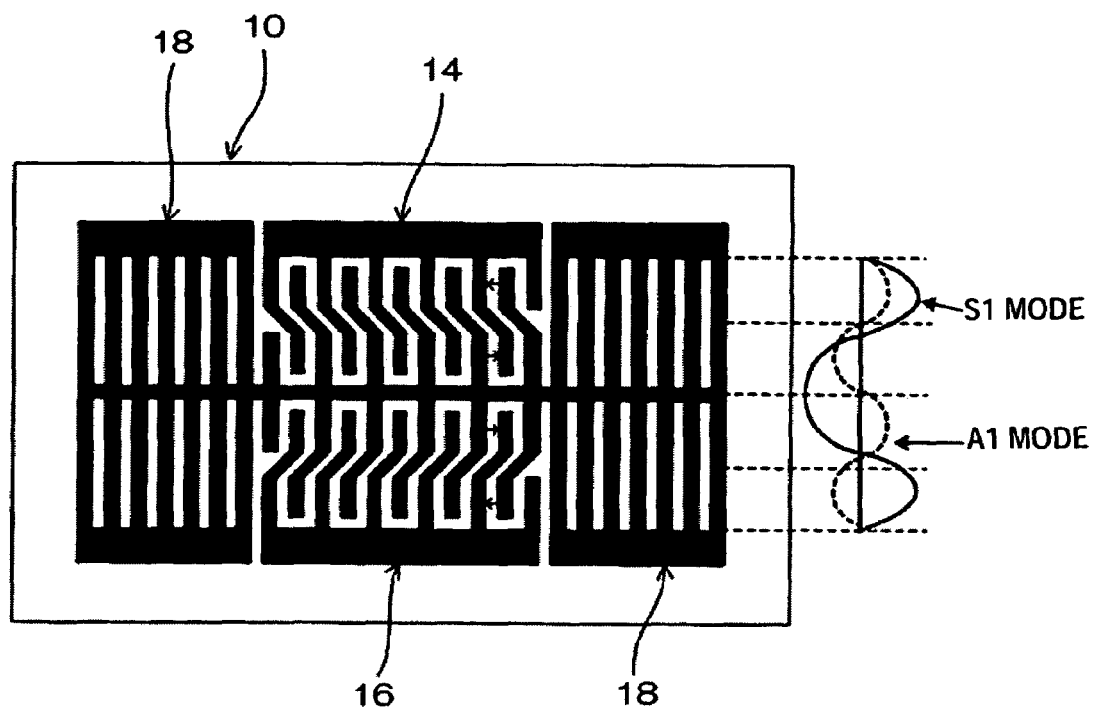
FIG. 2 is an explanatory view of the surface acoustic wave element and surface acoustic wave concerning the embodiment of the invention.
Figure 3:
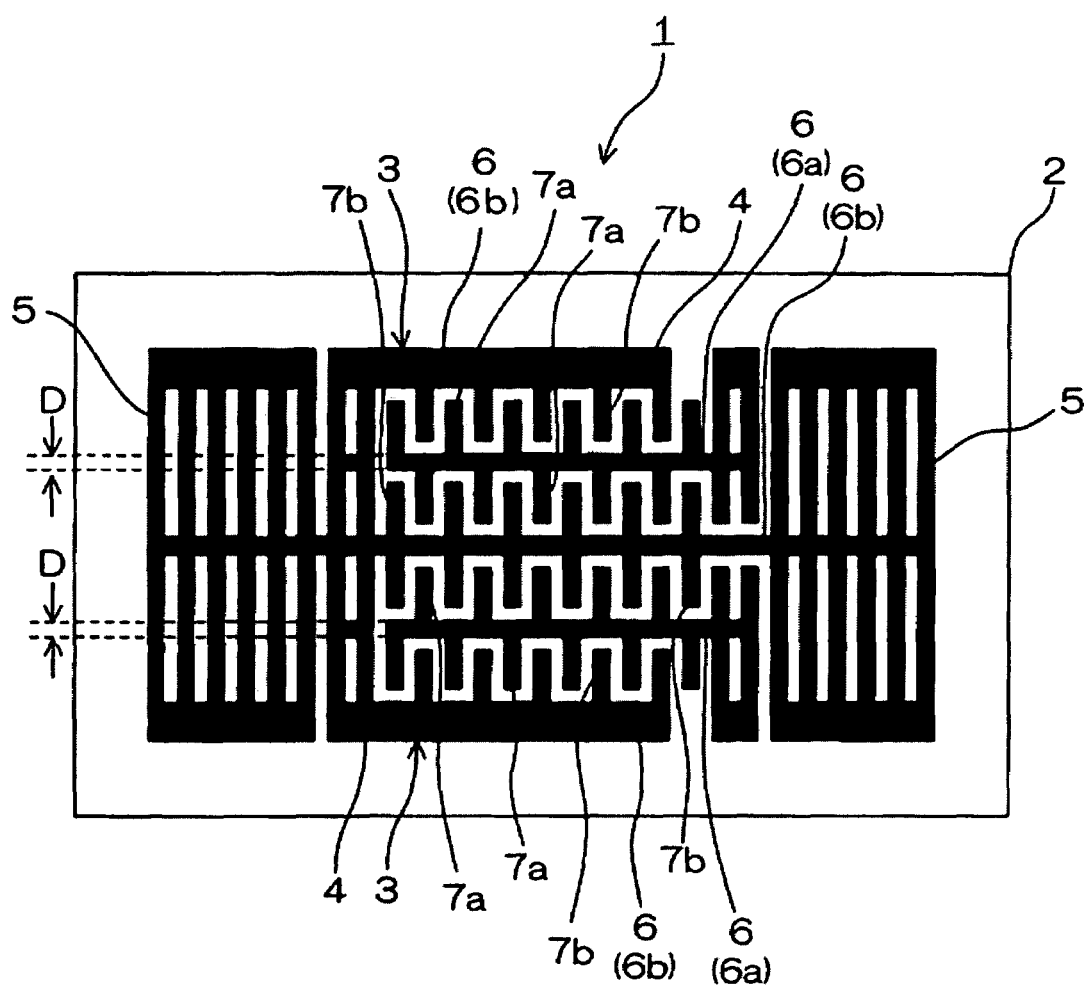
FIG. 3 is a schematic plan view of a surface acoustic wave filter concerning the conventional art.

Then, if supplying an electrical signal to the input electrode 14 of the SAW element 10 described above, a periodic mechanical strain will occur in each straight line portion 28 of the input electrode 14 due to the piezoelectricity effect of the piezo-electric substrate 12, to excite a surface acoustic wave propagating in the engaging direction of the electrode finger 22. Then, with this acoustic coupling, the surface acoustic wave propagating in the engaging direction of the electrode finger 32 at the output electrode 16 is excited, and an electrical signal is outputted from the output electrode 16 by piezoelectricity effect. At this time, as for the surface acoustic wave excited by the SAW element 10, the S1 mode (a primary symmetric mode) and the A1 mode (a primary slanting symmetric mode) shown in FIG. 2 are excited.

Specifically, in each of the straight line portions 28 and 38 of the input electrode 14 and the output electrode 16, an excitation electric field occurs in the reverse direction at the straight line portions 28b and 38b located outside and at the straight line portions 28a and 38a located inside, respectively. In addition, in FIG. 2, the excitation electric fields are shown by the arrow, and there are shown the modes where the excitation electric field is generated leftward in the straight line portions 28b and 38b located outside, and the modes where the excitation electric field is generated rightward in the straight line portions 28a and 38a located inside. With the driving electric fields mutually inverted by 180°, a vibration displacement of the S1 mode and the A1 mode will occur. Then, as for the S1 mode and the A1 mode, the displacement amount is approximately zero in the bending portions 26 and 36 each in the input electrode 14 and the output electrode 16, which enables an efficient excitation of the S1 mode and the A1 mode.

In this way, because the bending portions 26 and 36 are prepared in the input electrode 14 and output electrode 16 of the SAW element 10, an inverting configuration can be formed in the surface acoustic wave to be excited on the piezo-electric substrate 12. Thereby, a lateral-coupling multiplex-mode filter, in which the primary surface acoustic waves (S1 mode, A1 mode) are excited, can be formed. Moreover, this configuration is the same configuration as that of the lateral-coupling multiplex-mode filter, which excites surface acoustic waves (S0 mode, A0 mode) having a fundamental wave, except for having prepared the bending portions 26 and 36 in the electrode fingers 22 and 32. Accordingly, in the SAW element 10 concerning the embodiment of the invention, it is not necessary to prepare the power-supply conductor in the center of each IDT, which constitutes the input electrode and the output electrode, in order to excite the primary surface acoustic waves (S1 mode, A1 mode), unlike the SAW element according to the conventional art. It is therefore possible to prevent the loss produced in this power-supply conductor by the amount of the resistance, enabling the insertion loss of the filter to be made smaller as compared with the SAW element according to the conventional art.

Figure 4:
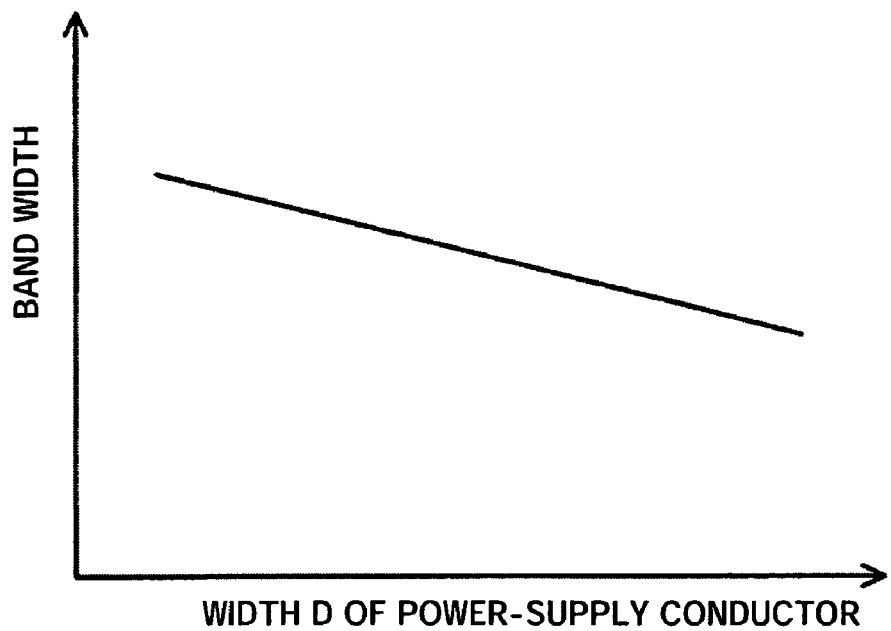
FIG. 4 is a view showing a relationship between the width D of a power-supply conductor, and the bandwidth.
Figure 5:
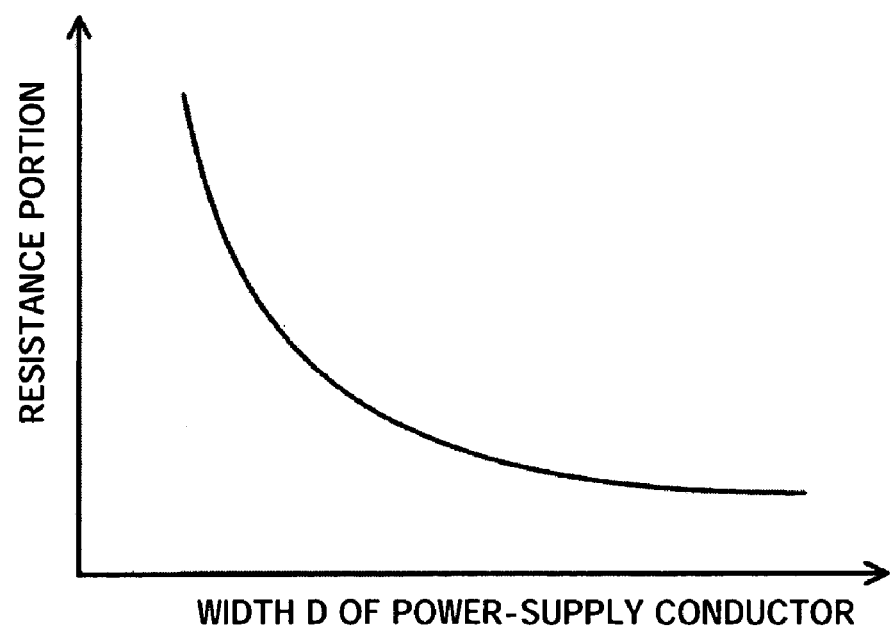
FIG. 5 is a view showing a relationship between the width D and the resistance portion of the power-supply conductor.
Figure 6:
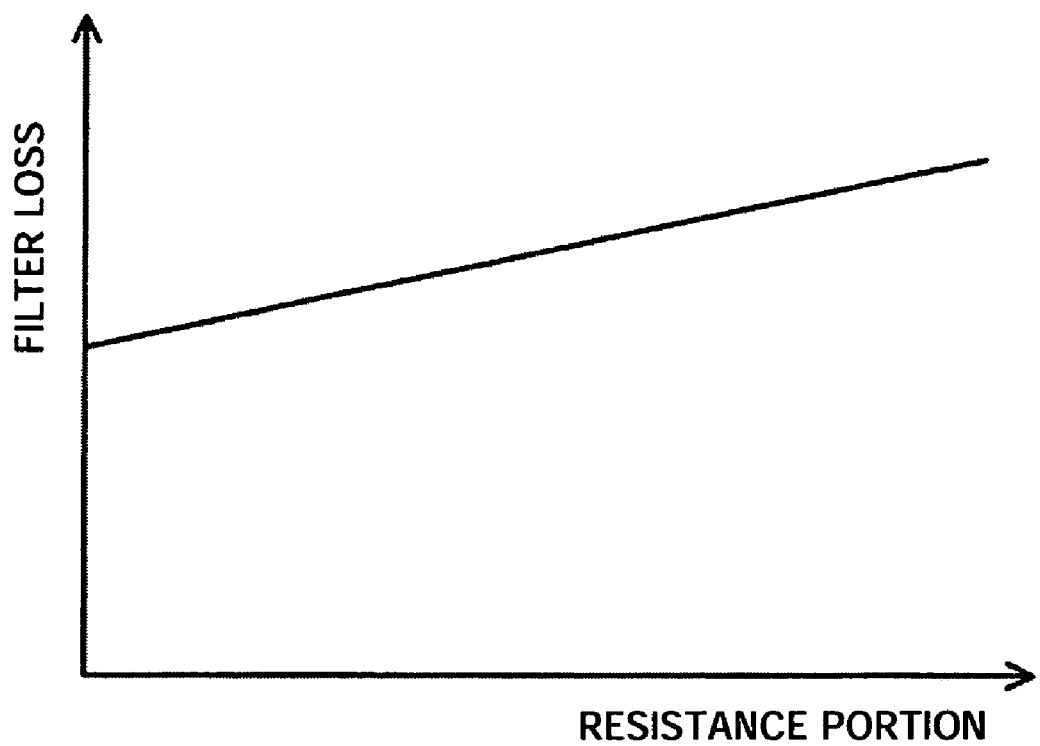
FIG. 6 is a view showing a relationship between the resistance portion and a filter loss.

In addition, when comparing the insertion loss of the filter of the SAW element 10 concerning the embodiment of the invention with the SAW element concerning the conventional art, the insertion loss of the SAW element 10 concerning the embodiment of the invention is at a 3 dB level, while the insertion loss of the SAW element concerning the conventional art is at about a 5 dB level. In this case, the number of pairs of IDTs, the number of electrode fingers of the reflector, and the width, length, height, or the like of these electrodes are set to be the same, thereby to set the outputted resonant frequency to be the same. From this result, in the SAW element 10 concerning the embodiment of the invention, it is appreciated that the insertion loss of the filter also becomes smaller because the resistance loss becomes smaller. Moreover, because in the SAW element 10 concerning the embodiment of the invention, the coupling portion is not provided in the center of each of the input electrode 14 and output electrode 16, the entire width of the coupling portion in the SAW element 10 will be narrower as compared with the entire width of the power-supply conductor of the SAW element according to the conventional art. Accordingly, from the relationship shown in FIG. 4, in the SAW element 10 concerning the embodiment of the invention, the bandwidth of a pass band can be made wider. Namely, the SAW element 10 concerning the embodiment of the invention can have a filter with a smaller insertion loss and with a wider pass band.

Moreover, for filters having a wide pass band, a piezo-electric substrate having a large electromechanical coupling coefficient is usually used. However, with the SAW element 10 concerning the embodiment of the invention, it is possible to obtain filters having a wide pass band, even if a piezo-electric substrate having a relatively small electromechanical coupling coefficient, for example, a crystal or the like is used.

Although in the embodiment of the invention described above, the configuration, in which one bending portion is prepared in each electrode finger of the input electrode and the output electrode to form two straight line portions, has been described, the invention is not limited to this. Namely, it is also possible to prepare a plurality of bending portions in each electrode finger to form a plurality of straight line portions. Thereby, SAW elements using a surface acoustic wave having a further higher order can be formed.

What is claimed is:

1. A surface acoustic wave element comprising:
   a pair of interdigital transducers arranged in parallel with a propagation direction of a surface acoustic wave;
   a reflector prepared at both sides of the interdigital transducers; and
   a coupling portion which mutually couples one end of a plurality of electrode fingers constituting one electrode portion of each interdigital transducer to be in common,
   wherein each of the electrode fingers includes a plurality of straight line portions and a bending portion between said straight line portions,
   wherein one of said straight line portions intersects with the coupling portion,
   wherein the bending portion formed in the interdigital transducer has an offset of $\lambda/2$ ($\lambda$: a wavelength of the surface acoustic wave) between one end side and the other end side of this bending portion, and
   wherein a gap of $\lambda/2$ is formed between the straight line portion to be connected to the one end side and the straight line portion to connected to the other end side.

2. The surface acoustic wave element according to claim 1, wherein the coupling portion of the interdigital transducer that is in common is electrically coupled with the reflector.

* * * * *